United States Patent
Kuroda

(10) Patent No.: US 6,326,842 B1
(45) Date of Patent: Dec. 4, 2001

(54) VARIABLE GAIN AMPLIFYING APPARATUS WHICH CAN CHANGE A GAIN DURING AN OPERATION

(75) Inventor: Hidehiko Kuroda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/714,555

(22) Filed: Nov. 16, 2000

(30) Foreign Application Priority Data

Nov. 17, 1999 (JP) ................................. 11-326496

(51) Int. Cl.⁷ ........................................ H03G 5/16
(52) U.S. Cl. ..................... 330/133; 330/134; 330/285
(58) Field of Search ............................. 330/133, 134, 330/254, 285

(56) References Cited

U.S. PATENT DOCUMENTS

| | | | |
|---|---|---|---|
| 4,816,772 | * | 3/1989 | Klotz ..................... 330/254 |
| 5,126,688 | * | 6/1992 | Nakanishi et al. ............ 330/285 |
| 5,757,230 | * | 5/1998 | Mangelsdorf ................ 330/133 |
| 5,900,781 | * | 5/1999 | Igarashi et al. .............. 330/254 |
| 6,127,890 | * | 10/2000 | Shimomura et al. ........... 330/254 |

FOREIGN PATENT DOCUMENTS

| | | | |
|---|---|---|---|
| 10-341122 | 12/1998 | (JP) | ............... H03G/3/10 |
| 11-27068 | 1/1999 | (JP) | ............... H03G/3/10 |

\* cited by examiner

*Primary Examiner*—Robert Pascal
*Assistant Examiner*—Henry Choe
(74) *Attorney, Agent, or Firm*—Hayes, Soloway, Hennessey, Grossman & Hage PC

(57) ABSTRACT

A variable gain amplifying apparatus which can accurately set a predetermined gain for amplifying. The variable gain amplifying apparatus has a first amplifying circuit, a second amplifying circuit and a third amplifying circuit. The first amplifying circuit can control a first gain during an operation. The second amplifying circuit is coupled to an output of the first amplifying circuit, in which a gain is fixed during an operation. The third amplifying circuit coupled to an output of the second amplifying circuit, in which a gain can be controlled during an operation. The apparatus can avoid deterioration in a distortion characteristic, an increase in a total noise figure and an increase in a consumptive electric power.

25 Claims, 7 Drawing Sheets

Fig. 1 PRIOR ART
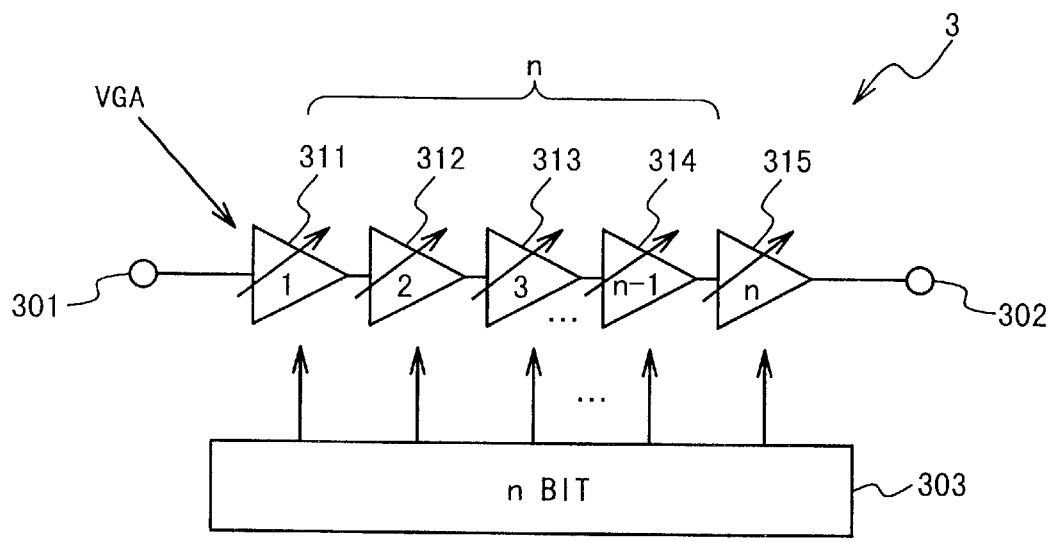
Fig. 2A PRIOR ART
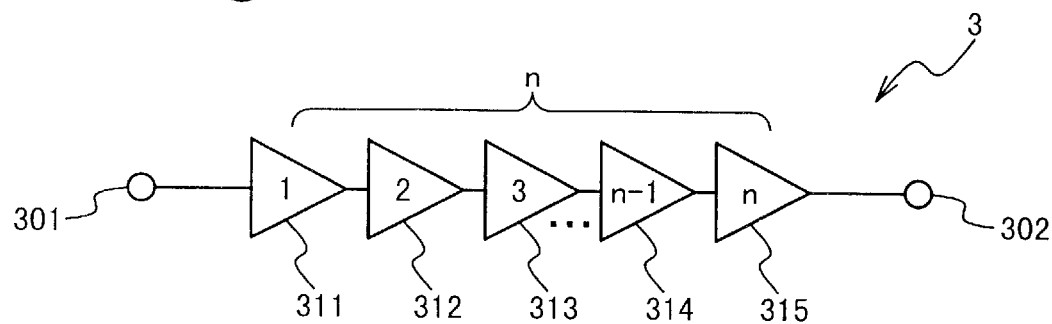
Fig. 2B PRIOR ART
|    | 1    | 2    | 3    | n-1    | n    |
|----|------|------|------|--------|------|
| G  | G1   | G2   | G3   | Gn-1   | Gn   |
| NF | NF1  | NF2  | NF3  | NFn-1  | NFn  |
| IP | IP31 | IP32 | IP33 | IP3n-1 | IP3n |

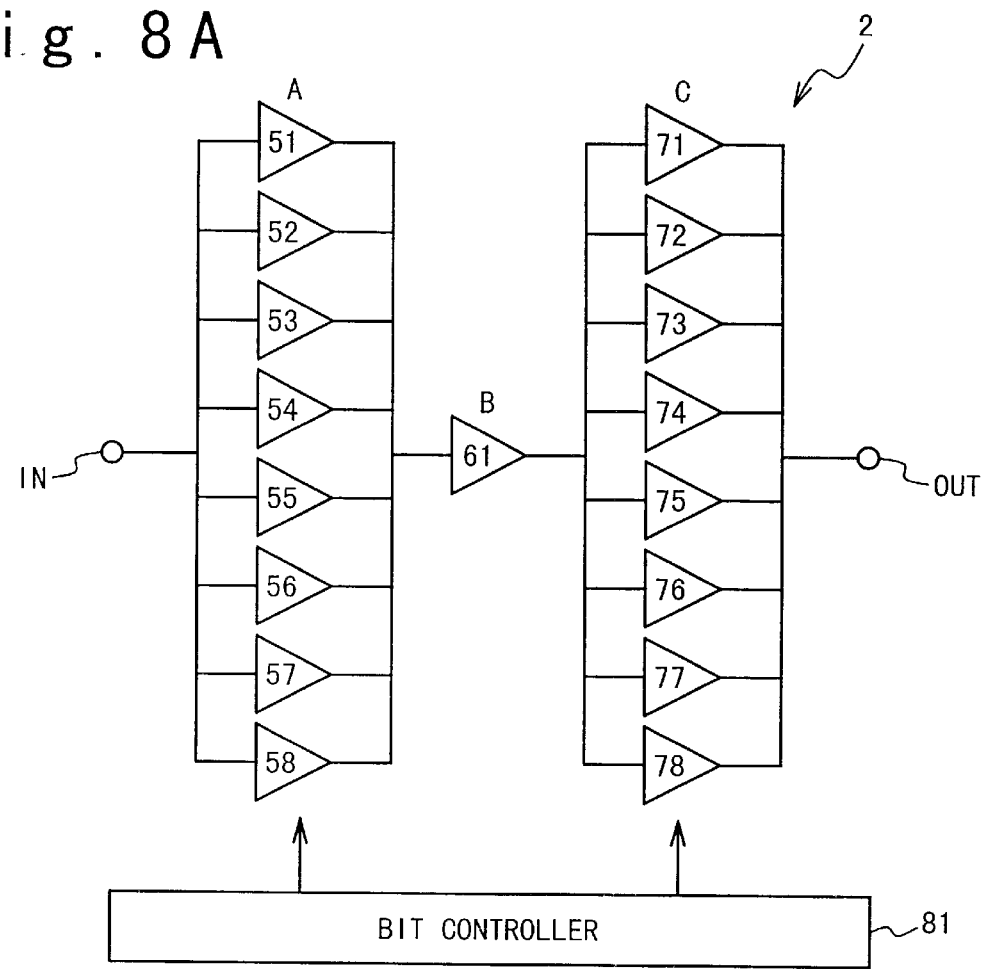

VARIABLE GAIN AMPLIFYING APPARATUS WHICH CAN CHANGE A GAIN DURING AN OPERATION

BACKGROUND OF THE INVENTION

1. Field of the Invention

The present invention relates to a variable gain amplifying apparatus which can set predetermined gain for amplifying.

2. Description of the Related Art

A variable gain amplifying apparatus has a plurality of digital control type amplifying circuits. A valid gain of the variable gain amplifying apparatus is equal to a total of specific gains of digital control type amplifying circuits to be made active. If the variable gain amplifying apparatus is provided with analog control type amplifying circuits, the valid gain of the variable gain amplifying apparatus is equal to a gain set for the analog control type amplifying circuit.

FIG. 1 shows a configuration of a conventional variable gain amplifying apparatus. A variable gain amplifying apparatus (VGA) 3 shown in FIG. 1 has an input 301, an output 302, an n-bit controller 303 and first to n-th variable gain circuits 311 to 315.

The input 301 is connected to an input of the first variable gain circuit 311. An output of the first variable gain circuit 311 is connected to an input of the second variable gain circuit 312. An output of the second variable gain circuit 312 is connected to an input of the third variable gain circuit 313. Similarly, an output of the (n−1)-th variable gain circuit 314 is connected to an input of the n-th variable gain circuit 315. An output of the n-th variable gain circuit 315 is connected to the output 302. An output of the n-bit controller 303 is connected to control terminals of the first to n-th variable gain circuits 311 to 315.

The input 301 is a terminal to which an input signal is inputted. The first variable gain circuit 311 is composed of variable amplifiers in which the gain (0 db, 32 dB) are set in accordance with a control signal outputted by the n-bit controller 303. The second variable gain circuit 312 is composed of variable amplifiers in wihch the gain (0 dB, 16 dB) are set in accordance with the control signal outputted by the n-bit controller 303. The third variable gain circuit 313 is composed of variable amplifiers in wihch the gain (0 dB, 8 dB) are set in accordance with the control signal outputted by the n-bit controller 303. The (n−1)-th (fourth) variable gain circuit 314 is composed of variable amplifiers in wihch the gain (0 dB, 4 dB) are set in accordance with the control signal outputted by the n-bit controller 303. The n-th (fifth) variable gain circuit 315 is composed of variable amplifiers in wihch the gain (0 dB, 2 dB) are set in accordance with the control signal outputted by the n-bit controller 303. The output 302 is a terminal from which the amplification signal amplified by the first to n-th (fifth) amplifiers 311 to 315 is outputted. The n-bit controller 303 outputs an n-bit parallel signal to the first to n-th (fifth) variable amplifiers 311 to 315. In this case, the n-bit implies a five-bit, corresponding to the first n-th (fifth) variable amplifiers 311 to 315. The most significant bit of the n-bit is inputted to, for example, the first variable gain circuit 311. In this case, the least significant bit of the n-bit is inputted to the n-th (fifth) variable gain circuit 315. A variable gain circuit receiving a valid bit (a value of 1) is turned ON (the amplification of 32, 16, 8, 4 or 2 dB). A variable gain circuit receiving an invalid bit (a value of 0) is turned OFF (the amplification of 0 dB). The gain of the variable gain amplifying apparatus 3 can be set to 0, 2, 4, . . . , or 32 db. By the way, the amplification degree of each variable gain circuit is not limited to the above-mentioned values. It may be set arbitrarily.

If the gain of the variable gain amplifying apparatus 3 is set to 2 dB, the n-bit controller 303 outputs a control signal (00001). In response to this control signal, the n-th (fifth) variable gain circuit 315 is turnedON (the gain of 2 dB), and the first to (n−1) (fourth) variable gain circuits 311 to 314 are turned OFF (the gain of 0 dB). If the gain of the variable gain amplifying apparatus 3 is set to 32 dB, the n-bit controller 303 outputs a control signal (11111). In response to this control signal, the first to n-th (fifth) variable amplifiers 311 to 315 are turned ON (the gain of 32+16+8+4+2 dB) . By the way, the control is not limited to the above-mentioned cases. It may be set arbitrarily.

If the amplifying circuits are connected in multiple stages, the total gain implies the total of the gains in the respective amplifying circuits. The values of the respective amplifying circuits are reflected in the total value of noise figures and distortion values.

FIGS. 2A, 2B show the characteristics of the variable gain amplifying apparatus. FIG. 2A shows the configuration to describe the performances of the variable gain amplifying apparatus 3 (FIG. 1), and FIG. 2B shows the performance parameters of the variable gain amplifying apparatus.

A variable gain amplifying apparatus 3 shown in FIG. 2A is provided with an input 301, an output 302 and first to n-th amplifying circuits 311 to 315.

An input 301 is connected to an input of the first amplifying circuit 311. An output of the first amplifying circuit 311 is connected to an input of the second amplifying circuit 312. An output of the second amplifying circuit 312 is connected to an input of the third amplifying circuit 313. Similarly, an output of the (n−1)-th amplifying circuit 314 is connected to an input of the n-th amplifying circuit 315. An output of the n-th amplifying circuit 315 is connected to the output 302.

The first amplifying circuit 311 has a gain G1. The second amplifying circuit 312 has a gain G2. The third amplifying circuit 313 has a gain G3. The (n−1) -th amplifying circuit 314 has a gain G(n−1). And, the n-th amplifying circuit 315 has a gain Gn. As for a noise figure NF, similarly, the first to n-th amplifying circuits have noise figures NF1 to NFn, respectively. As for a distortion IP3, similarly, the first to n-th amplifying circuits have distortions IP31 to IP32, respectively.

A total gain Gt (dB) of the variable gain circuit 3 (which is assumed to have three stages) is represented by the following equation 1:

$$Gt = G1 + G2 + G3 + \ldots + Gn$$

A total noise figure NFt (a true number) is represented by the following equation 2:

$$NFt = NF1 + (NF2-1)/G1 + (NF3-1)/(G1*G2) + \ldots + (NFn-1)/(G1*G2*G3 \ldots *G(n-1))$$

A total distortion IP3t (a true number) is represented by the following equation 3:

$$IP3t = 1/(1/IP31 + G1/IP32 + G1*G2/IP33 + G1*G2*G3* \ldots *G(n-1)/IP3n)$$

As can be evident from the equation (2), if the noise figure NF1 of the first amplifying circuit is small and the gain G1 is large, the total noise figure NFt can be made smaller. On the other hand, the increase in the number of stages in the amplifying circuits causes the total noise figure NFt to be larger. In order to obtain a desirable total gain Gt, it is necessary that the amplifying circuit has a larger number of stages. In the conventional variable gain amplifying apparatus 3, it is difficult to drop the total noise figure NFt.

The amplifying circuits are coupled in series. Thus, it is necessary that even the amplifying circuit whose gain is set to 0 dB is always made active. In the conventional variable gain amplifying apparatus 3, it is difficult to drop a consumptive electric power.

The increase in the number of stages in the amplifying circuits constituting the variable gain amplifying apparatus causes the influence of the amplification characteristic of each amplifying circuit to be larger. The inaccurate setting of the gain of each amplifying circuit increases an error in the total gain Gp. The increase in the number of stages in the amplifying circuit constituting the variable gain amplifying apparatus and further the change in the total gain Gt vary an impedance of the amplifying circuit whose gain is changed. The variation in the impedance increases the error of the total gain Gp. The increase in the number of stages in the amplifying circuit constituting the variable gain amplifying apparatus reduces a phase margin of the variable gain amplifying apparatus to thereby deteriorate the phase characteristic thereof. The deterioration of the phase characteristic causes an abnormal oscillation.

The technique according to the variable gain amplifying apparatus is disclosed in Japanese Laid Open Patent Application (JP-A-H10-341122) and Japanese Laid Open Patent Application (JP-A-H11-27068). Those gazettes disclose the technique for attaining an improvement in a setting accuracy of a gain. However, those gazettes do not disclose the decrease in the number of stages in the variable gain circuit and the effect associated with the decrease in the number of stages at all.

SUMMARY OF THE INVENTION

The present invention provides a variable gain amplifying apparatus which can obtain a desirable total gain and simultaneously avoid an increase in a total noise figure and an increase in a consumptive electric power.

The variable gain amplifying apparatus according to the invention includes a first amplifying circuit, a second amplifying circuit, a third amplifying circuit and a gain controller. The first amplifying circuit has a first variable gain when the first amplifying circuit is activated. The second amplifying circuit has a second gain and an input which is connected to an output of the first amplifying circuit. The third amplifying circuit has a third gain when the third amplifying circuit is activated and has an input which is connected to an output of the second amplifying circuit.

In the above variable gain amplifying apparatus, a gain controller generates gain control signals which are applied to the first and third amplifying circuits such that the first and third gains are set to a predetermined gains, respectively.

In the above variable gain amplifying apparatus, the second gain is a fixed gain.

In the above variable gain amplifying apparatus, the first amplifying circuit includes a plurality of first amplifiers which are activated to set the first variable gain based on the gain control signal. Furthermore, the second amplifying circuit has a single second amplifier and the third amplifying circuit includes a plurality of third amplifiers which are activated to set the third variable gain based on the gain control signal.

In the above variable gain amplifying apparatus, the first amplifiers are digitally controlled based on the control signal and the third amplifiers are digitally controlled based on the control signal.

In the above variable gain amplifying apparatus, the first amplifiers are analog controlled based on the control signal and the third amplifiers are analog controlled based on the control signal.

In the above variable gain amplifying apparatus, each of the first and third amplifiers has a transistor which is controlled based on a voltage or a current which is applied to the transistor based on the control signal.

In the above variable gain amplifying apparatus, the first variable gain of the first amplifying circuit is larger than the third variable gain of the third amplifying circuit.

In the above variable gain amplifying apparatus, the second amplifying circuit functions to prevent in the case of an effect a first impedance of the first amplifying circuit to the third amplifying circuit.

In the variable gain amplifying apparatus, the second gain is a variable fixed gain.

In the above variable gain amplifying apparatus, the first amplifying circuit includes a plurality of first amplifiers which are activated to set the first variable gain based on the gain control signal. Furthermore, the second amplifying circuit has a single second amplifier of which gain is changed when the second amplifying circuit is in activated, and the third amplifying circuit includes a plurality of third amplifiers which are activated to set the third variable gain based on the gain control signal.

In the above variable gain amplifying apparatus, the first amplifiers are digitally controlled based on the control signal. Furthermore, the second amplifiers are digitally controlled based on the control signal and the third amplifiers are digitally controlled based on the control signal.

In the above variable gain amplifying apparatus, the first amplifiers are analog controlled based on the control signal and the third amplifiers are analog controlled based on the control signal.

In the above variable gain amplifying apparatus, each of the first and third amplifiers has a transistor which is controlled based on a voltage or a current which is applied to the transistor based on the control signal.

In the above variable gain amplifying apparatus, the first variable gain of the first amplifying circuit is larger than the third variable gain of the third amplifying circuit.

In the above variable gain amplifying apparatus, the second amplifying circuit functions to prevent in the case of a first impedance of the first amplifying circuit to the third amplifying circuit.

In the above variable gain amplifying apparatus, the first amplifying circuit includes a plurality of first amplifiers which are activated to set the first variable gain based on the gain control signal. Furthermore, the second amplifying circuit includes a plurality of second amplifiers which are activated to set the second variable gain based on the gain control signal when the. second amplifying circuit is activated and the third amplifying circuit includes a plurality of third amplifiers which are activated to set the third variable gain based on the gain control signal.

In the above variable gain amplifying apparatus, the first amplifiers are digitallycontrolledbasedonthe control signal. Furthermore, the second amplifiers are digitally controlled based on the control signal and the third amplifiers are digitally controlled based on the control signal.

In the above variable gain amplifying apparatus, the first amplifiers are analog controlled based on the control signal. Furthermore, the second amplifiers are analog controlled based on the control signal and the third amplifiers are analog controlled based on the control signal.

In the above variable gain amplifyin apparatus, each of the first and third amplifiers has a transistor which is controlled based on a voltage or a current which is applied to the transistor based on the control signal.

In the above variable gain amplifying apparatus, wherein the first variable gain of the first amplifying circuit is larger than the third variable gain of the third amplifying circuit.

In the above variable gain amplifying apparatus, the second amplifying circuit functions to prevent in the case of a first impedance of the first amplifying circuit to the third amplifying circuit.

In the variable gain amplifying apparatus, the second amplifying circuit has an impedance matching function to prevent in the case of an effect a first impedance of the first amplifying circuit to the third amplifying circuit.

In the variable gain amplifying apparatus, the second amplifying circuit has an impedance matching function to prevent in the case of an effect of a first impedance of the first amplifying circuit to the third amplifying circuit.

A method for controlling a variable gain amplifying apparatus according to the invention includes a setting of a first gain of a first variable gain circuit and a setting of a second gain of a second variable gain circuit which is arranged on a later stage of the first variable gain circuit. Furthermore, the method for controlling a variable gain amplifying apparatus setting of a third gain of a third variable gain circuit such that the first gain is larger than the third gain.

In the above method for controlling a variable gain amplifying apparatus includes generating of a control signal which is applied to the first to the third variable gain circuits and controls the first to third gain.

In the above method for controlling a variable gain amplifying apparatus includes separating of the first amplifying circuit and the third variable gain circuit by the second amplifying circuit such that a first impedance of the first variable gain circuit and a third impedance of the third amplifying circuit are separated.

BRIEF DESCRIPTION OF THE DRAWINGS

FIG. 1 is a view showing a configuration of a conventional variable gain amplifying apparatus;

FIG. 2A is a view showing a performance to describe a performance of a variable gain amplifying apparatus;

FIG. 2B is a view showing performance parameters of the variable gain amplifying apparatus;

FIG. 8A is a view showing a device arrangement in a configuration of a second gain amplifying apparatus according to the present invention; and FIG. 8B is a view showing a gain performance of the second gain amplifying apparatus according to the present invention.

DESCRIPTION OF THE PREFERRED EMBODIMENTS

Figure 3A:
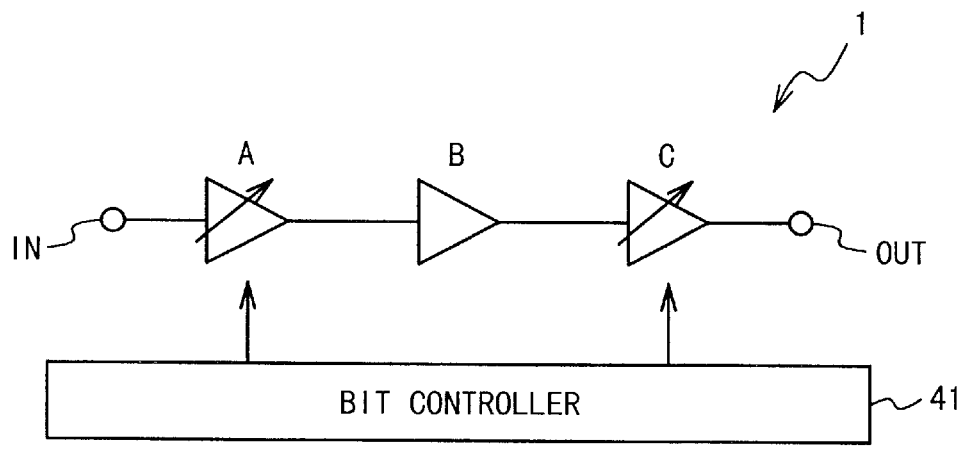
FIG. 3A is a view showing a concept of a configuration example of a first variable amplifying circuit according to the present invention.
Figure 3B:
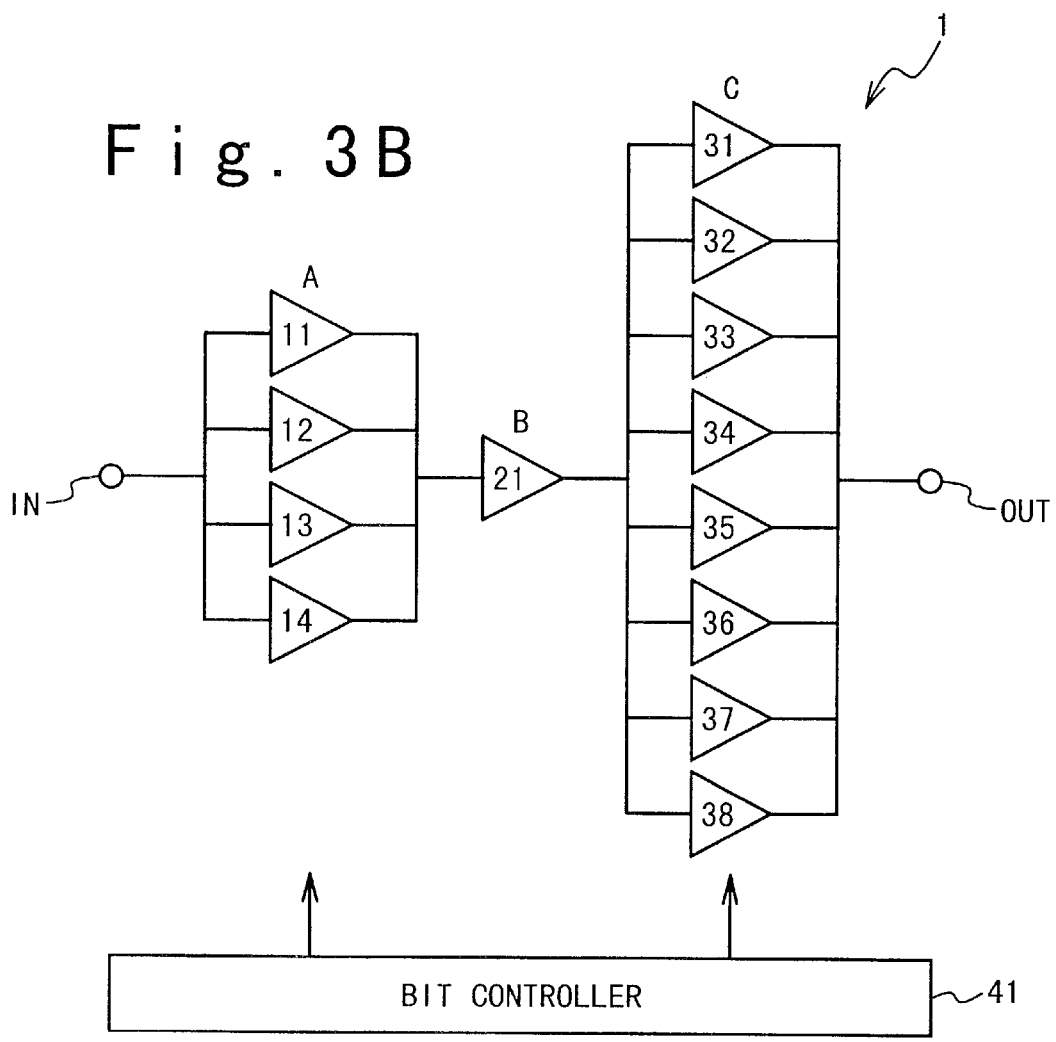
FIG. 3B is a view showing a detailed configuration of the first variable amplifying circuit according to the present invention.

FIG. 3A shows the concept of a first configuration example of a variable gain amplifying apparatus 1 according to the present invention. And, FIG. 3B shows the detailed configuration of the first example of the variable gain amplifying apparatus 1 according to the present invention.

The variable gain amplifying apparatus 1 shown in FIG. 3A is provided with an input IN, an output OUT, a first amplifying circuit A, a second amplifying circuit B, a third amplifying circuit C and a digital bit controller (gain control signal generator) 41. Gains of the first amplifying circuit A and the third amplifying circuit C can be changed during the operation of the variable gain amplifying apparatus 1, in accordance with the control of the digital bit controller 41. A gain of the second amplifying circuit B is fixed.

The detailed configuration of the variable gain amplifying apparatus 1 will be described below with reference to FIG. 3B. The variable gain amplifying apparatus 1 shown in FIG. 1B is provided with the input IN, the output OUT, the first amplifying circuit A, the second amplifying circuit B, the third amplifying circuit C and the digital bit controller (gain control signal generator) 41. The first amplifying circuit A is composed of A1-th to A4-th amplifiers 11 to 14. The second amplifying circuit B is composed of a B1-th amplifier 21. And, the third amplifying circuit C is composed of C1-th to C8-th amplifiers 31 to 38. The second amplifying circuit B has an impedance matching function to prevent in the case of an effect of a first impedance of the first amplifying circuit to the third amplifying circuit. By the impedance matching function, an impedance interference (a gain deviation) between the effect of the impedance of the first amplifying circuit and the effect of the impedance of the third amplifying circuit is prevented.

The input IN is inputted to inputs of the A1-th to A4-th amplifiers 11 to 14. Outputs of the A1-th to A4-th amplifiers 11 to 14 are connected to an input of the B1-th amplifier 21. An output of the B1-th amplifier 21 is connected to inputs of the C1-th to C8-th amplifiers 31 to 38. And, outputs of the C1-th to C8-th amplifiers 31 to 38 are connected to the output OUT.

The digital bit controller 41 outputs a first control signal to the first amplifying circuit A. The first control signal indicates two-bit values (00) to (11) since the first amplifying circuit A is composed of the A1-th to A4-th amplifiers 11 to 14 (four stages (=twenty-second stages)). The digital bit controller 41 outputs a second control signal to the third amplifying circuit C. The second control signal indicates three-bit values (000) to (111), since the third amplifying circuit C is composed of the C1-th to C6-th amplifiers 31 to 38 (eight stages (=twenty-three stages)).

The input IN is a terminal to which an input signal is inputted. A gain of the first amplifying circuit A is set in accordance with the first control signal outputted by the digital bit controller 41.

The gain of the first amplifying circuit A is set in accordance with the first control signal. If the first control signal indicates the value (00), the A1-th amplifier 11 is made active. The A1-th amplifier 11 executes an amplification of the gain of 0 dB. The gain of the first amplifying circuit A indicates 0 dB. If the first control signal indicates the value (01), the A2-th amplifier 12 is made active. The A2-th amplifier 12 executes an amplification of the gain of 16 dB. The gain of the first amplifying circuit A indicates 16 dB. If the first control signal indicates the value (10), the A3-th amplifier 13 is made active. The A3-th amplifier 13 executes an amplification of the gain of 32 dB. The gain of the first amplifying circuit A indicates 32 dB. If the first control signal indicates the value (11), the A4-th amplifier 14 is made active. The A4-th amplifier 14 executes an amplification of the gain of 48 dB. The gain of the first amplifying circuit A indicates 48 dB. By the way, the value of the control signal is one example. It may be arbitrarily set.

The B1-th amplifier 21 of the second amplifying circuit B is always made active. The B1-th amplifier 21 executes an amplification of the gain of 8 dB. The gain of the second amplifying circuit B indicates 8 dB.

The gain of the third amplifying circuit C is set in accordance with the second control signal. If the second control signal indicates the value (000), the C1-th amplifier 31 is made active. The C1-th amplifier 31 executes an amplification of a gain of −8 dB. The gain of the third amplifying circuit C indicates −8 dB. If the second control signal indicates the value (001), the C2-th amplifier 32 is made active. The C2-th amplifier 32 executes an amplification of a gain of −4 dB. The gain of the third amplifying circuit C indicates −4 dB. If the second control signal indicates the value (010), the C3-th amplifier 33 is made active. The C3-th amplifier 33 executes an amplification of the gain of 0 dB. The gain of the third amplifying circuit C indicates 0 dB. If the second control signal indicates the value (011), the C4-th amplifier 34 is made active. The C4-th amplifier 34 executes an amplification of the gain of 4 dB. The gain of the third amplifying circuit C indicates 4 dB. if the second control signal indicates the value (100), the C5-th amplifier 35 is made active. The C5-th amplifier 35 executes an amplification of the gain of 8 dB. The gain of the third amplifying circuit C indicates 8 dB. if the second control signal indicates the value (101), the C6-th amplifier 36 is made active. The C6-th amplifier 36 executes an amplification of a gain of 12 dB. The gain of the third amplifying circuit C indicates 12 dB. If the second control signal indicates the value (110), the C7-th amplifier 37 is made active. The C7-th amplifier 37 executes an amplification of the gain of 16 dB. The gain of the third amplifying circuit C indicates 16 dB. And, if the second control signal indicates the value (111) the C8-th amplifier 38 is made active. The C8-th amplifier 38 executes an amplification of a gain of 20 dB. The gain of the third amplifying circuit C indicates 20 dB. By the way, the value of the control signal is one example. It may be arbitrarily set.

The variable gain amplifying apparatus 1 according to the present invention executes the minimum amplification of 0 dB. The variable gain amplifying apparatus 1 executes the maximum amplification of 76 dB. The first control signal outputted by the digital bit controller 41 indicates the two-bit digital signal. The second control signal outputted by the digital bit controller 41 indicates the three-bit digital signal.

If a five-bit digital control signal is outputted by the digital bit controller 41, a portion of the higher two bits indicates the first control signal, and a portion of the lower three bits indicates the second control signal.

It is desirable to set the gains of the first amplifying circuit A and the second amplifying circuit C such that the gain of the first amplifying circuit A is greater than that of the third amplifying circuit C. Such a setting contributes to a drop in a noise figure NF of the variable gain amplifying apparatus.

Figure 4A:
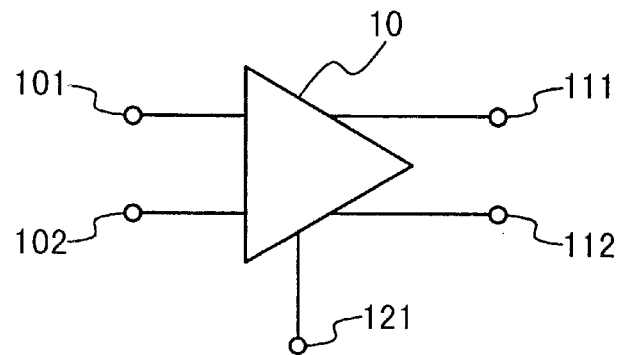
FIG. 4A is a view showing symbols of a configuration of an amplifier according to the present invention.
Figure 4B:
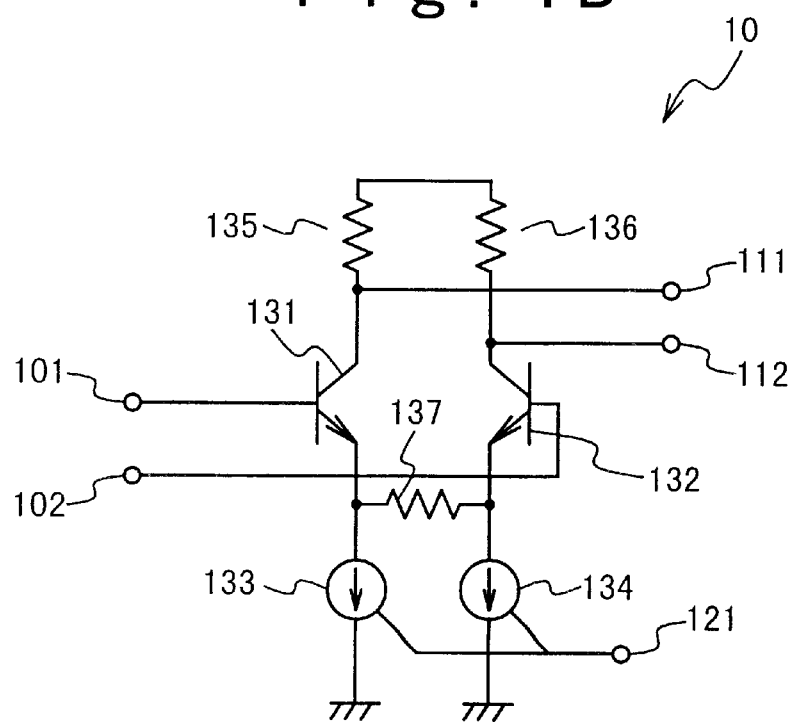
FIG. 4B is a view showing a circuit of the amplifier according to the present invention.

FIGS. 4A, 4B show the configuration example according to the present invention. FIG. 4A shows symbols of an amplifier 10 according to the present invention. FIG. 4B shows a circuit of the amplifier 10 according to the present invention. The amplifier 10 shown in FIG. 4A is provided with input terminals 101, 102, output terminals 111, 112 and a switch terminal 121.

The input terminals 101, 102 have the configurations corresponding to that of the input IN (FIG. 3). The input terminals 101, 102 receive the input signals. The output terminals 111, 112 have the configurations corresponding to that of the output OUT (FIG. 3). The output terminals 111, 112 output the output signals. The switch terminal 121 is the terminal for receiving the first and second control signals outputted by the digital bit controller 41. If the A1-th amplifier 11 is constituted by the amplifier 10, the switch terminal 121 receives the first control signal. If the first control signal indicative of the value (00) is inputted to the switch terminal 121 of the A1-th amplifier 11, the A1-th amplifier 11 is made active. If the C1-thamplifier 31 is constituted by the amplifier 10, the switch terminal 121 receives the second control signal. If the second control signal indicative of the value (000) is inputted to the switch terminal 121 of the C1-th control signal 31, the C1-th control signal 31 is made active.

The amplifier 10 shown in FIG. 4B is provided with the input terminals 101, 102, the output terminals 111, 112, the switch terminal 121, a first transistor 131, a second transistor 132, a first current source 133, a second current source 134, a first resistor 135, a second resistor 136 and a coupling resistor 137.

The input terminal 101 is connected to a base of the first transistor 131. An emitter of the first transistor 131 is connected to an input of the first current source 133. An output of the first current source 133 is grounded. A collector of the first transistor 131 is connected to the output terminal 111. The collector of the transistor 131 is connected to one end of the first resistor 135. The input terminal 102 is connected to a base of the second transistor 132. An emitter of the second transistor 132 is connected to an input of the second current source 134. An output of the second current source 134 is grounded. A collector of the second transistor 132 is connected to the output terminal 112. The collector of the second transistor 132 is connected to one end of the second transistor 136. The other end of the second transistor 136 is connected to the other end of the first resistor 135. The emitter of the first transistor 131 is connected through the coupling resistor 137 to the emitter of the second transistor 132. The switch terminal 121 is connected to the first current source 133 and the second current source 134.

If the first or second control signal is inputted to the switch terminal 121, the first current source 133 and the second current source 134 are actuated. When the first and second current sources 133, 134 are actuated, the first and second transistors 131, 132 are turned on, respectively. The amplifier 10 carries out an amplification of a predetermined gain.

Figure 5A:
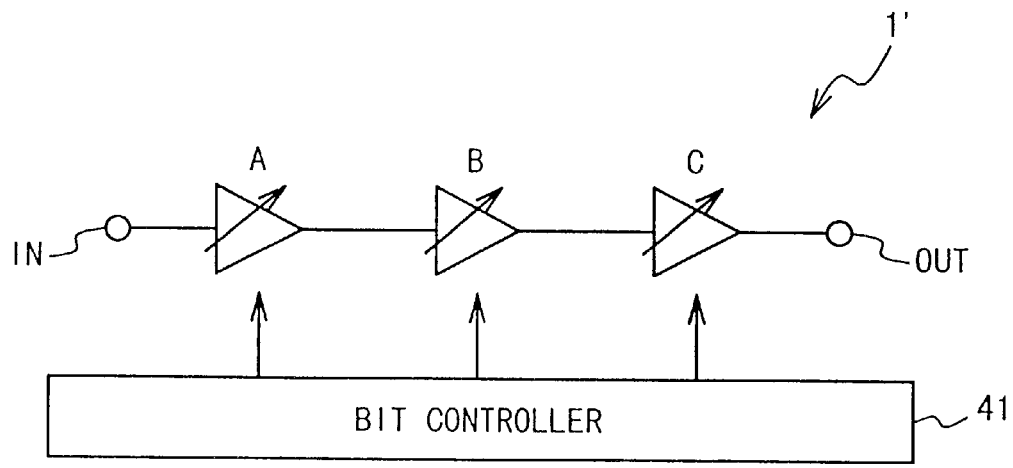
FIG. 5A is a view showing a concept of another configuration of the amplifier according to the present invention.
Figure 5B:
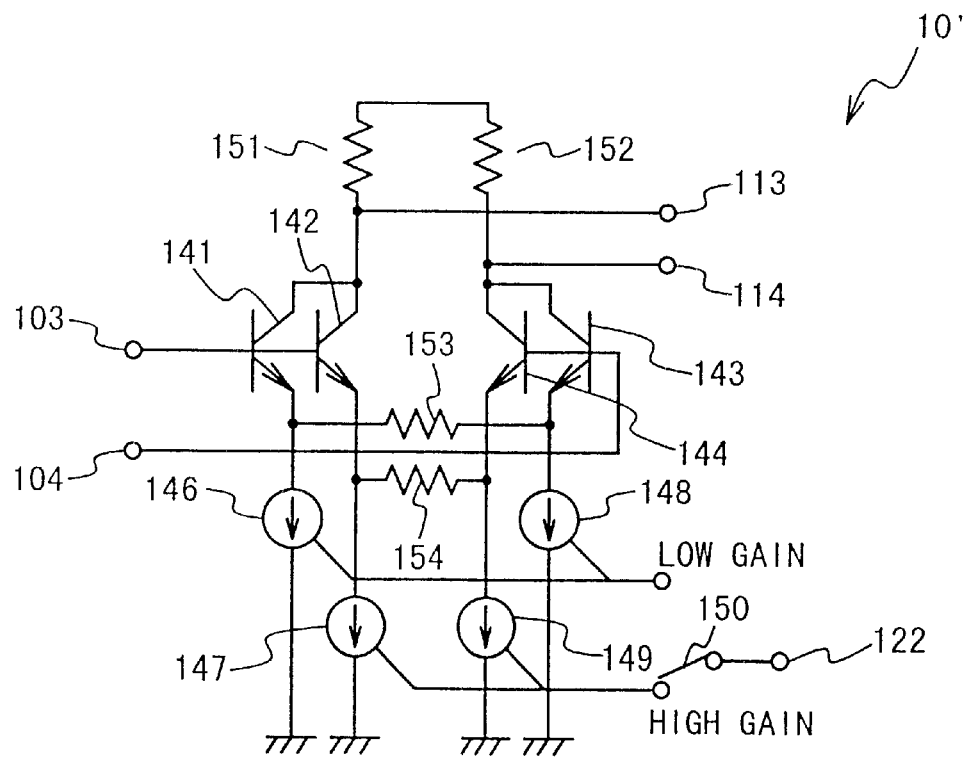
FIG. 5B is a view showing another configuration of the amplifier according to the present invention.

FIGS. 5A, 5B show another configuration example of an amplifier according to the present invention. FIG. 5A shows the concept of the configuration of a variable gain amplifying apparatus 1' according to the present invention. FIG. 5B shows the configuration of a digitally controlled variable amplifier 10.

The variable gain amplifying apparatus 1' shown in FIG. 5A is provided with an input IN, an output OUT, a first amplifying circuit A, a second amplifying circuit B, a third amplifying circuit C and a digital bit controller (gain control signal generator) 41. Gains of the first and third amplifying circuits A, C can be changed during the operation of the variable gain amplifying apparatus 1', in accordance with a first control signal and a second control signal outputted by the digital bit controller 41.

A gain of the second amplifying circuit B can be changed before the operation (before the execution of an amplifying operation) of the variable gain amplifying apparatus 1', in accordance with a third control signal outputted by the digital bit controller 41.

The digitally controlled variable amplifier 10' shown in FIG. 5B is a well known amplifier. The digitally controlled variable amplifier 10' can be used in the conventional variable gain circuit shown in FIG. 1. Also, the digitally controlled variable amplifier 10' may constitute the first to third amplifying circuits A to C according to the present invention.

The amplifier 10' shown in FIG. 5B can carry out an amplification at two kinds.(a low gain and a high gain) of gains. The amplifier 10 shown in FIG. 5B is provided with input terminals 103, 104, output terminals 113, 114, a switch terminal 122, a first transistor 141, a second transistor 142, a third transistor 143, a fourth transistor 144, a first current source 146, a second current source 147, a third current source 148, a fourth current source 149, a first resistor 151, a second resistor 152, a first coupling resistor 153 and a second coupling resistor 154.

The input terminal 103 is connected to a base of the first transistor 141. An emitter of the first transistor 141 is connected to an input of the first current source 146. An output of the first current source 146 is grounded. A collector of the first transistor 141 is connected to the output terminal 113. The collector of the first transistor 141 is connected to one end of the first resistor 151. The input terminal 103 is connected to a base of the second transistor 142. An emitter of the second transistor 142 is connected to an input of the second current source 147. An output of the second current source 147 is grounded. A collector of the second transistor 142 is connected to the output terminal 113. The collector of the second transistor 142 is connected to one end of the first resistor 151. And, the collector of the first transistor 141 is connected to the collector of the second transistor 142.

The input terminal 104 is connected to a base of the third transistor 143. An emitter of the third transistor 143 is connected to an input of the third current source 148. An output of the third current source 148 is grounded. A collector of the third transistor 143 is connected to the output terminal 114. The collector of the third transistor 143 is connected to one end of the second resistor 152. The input terminal 104 is connected to a base of the fourth transistor 144. An emitter of the fourth transistor 144 is connected to an input of the fourth current source 149. An output of the fourth current source 149 is grounded. A collector of the fourth transistor 144 is connected to the output terminal 114. The collector of the fourth transistor 144 is connected to one end of the second resistor 152. The collector of the third transistor 143 is connected to the collector of the fourth transistor 144. The emitter of the first transistor 141 is connected through the first coupling resistor 153 to the emitter of the third transistor 143. The emitter of the second transistor 142 is connected through the second coupling resistor 154 to the emitter of the fourth transistor 144. The switch terminal 122 is connected through a low gain terminal of a switch 150 to the first and third current sources 146, 148. And, the switch terminal 122 is connected through a high gain terminal of the switch 150 to the second and fourth current sources 147, 149.

If the first amplifying circuit A (Fic. 3B and FIG. 5A) is constituted by four digitally controlled variable amplifiers 10', the first control signal (a valid bit or an invalid bit) outputted by the controller 41 is inputted to the switch terminal 122. If the third amplifying circuit C (FIG. 3B and FIG. 5A) is constituted by eight digitally controlled variable amplifiers 10', the second control signal (the valid bit or the invalid bit) outputted by the controller 41 is inputted to the switch terminal 122.

If the second amplifying circuit B (FIG. 5A) is constituted by one digitally controlled variable amplifier 10', the third control signal (the valid bit or the invalid bit) outputted by the controller 41 is inputted to the switch terminal 122. The third control signal is outputted by the controller 41 if the variable gain amplifying apparatus 1' has the configuration in which the gain of the second amplifying circuit B can be set before the operation. The third control signal is used to control the change in the gain of the second amplifying circuit B.

The high gain terminal of the switch 150 is selected if the valid bit is inputted to the switch terminal 122 of the digitally controlled variable amplifier 10'. If the high gain terminal is selected, the first current source 146 and the third current source 148 are actuated as a pair. The low gain terminal of the switch 150 is selected if the invalid bit is inputted to the switch terminal 122. If the low gain terminal is selected, the second current source 147 and the fourth current source 149 are actuated as a pair. The valid bit is a signal for setting the digitally controlled variable amplifier 1 at a high gain amplification state. The invalid bit is a signal for setting the digitally controlled variable amplifier 10' at a low gain amplification state.

If the digitally controlled variable amplifier 10' is applied to the second amplifying circuit B, the switch 150 is set at the state before the operation (the amplifying process) of the variable gain amplifying apparatus 1', and it is fixed during the operation (during the amplifying process). For example, in the digitally controlled variable amplifier 10' (the second amplifying circuit B) , the input of the valid bit causes the gain of 16 dB to be set. Similarly, in the digitally controlled variable amplifier 10' (the second amplifying circuit B), the input of the invalid bit causes the gain of 0 dB to be set. If change widths of the gains of the first and third amplifying circuits A, C have the values described in FIG. 3B, the variable gain amplifying apparatus 1' can carry out the amplification of −8 to 68 dB or 8 dB to 84 dB. That is, if the invalid bit is inputted to the digitally controlled variable amplifier 10' (the second amplifying circuit B), the gain is set to 0 dB, and the variable gain amplifying apparatus 1' can carry out the amplification of −8 to 68 dB. Similarly, if the valid bit is inputted to the digitally controlled variable amplifier 10' (the second amplifying circuit B), the gain is set to 16 dB, and the variable gain amplifying apparatus 1' can carry out the amplification of 8 to 84 dB.

Figure 6A:
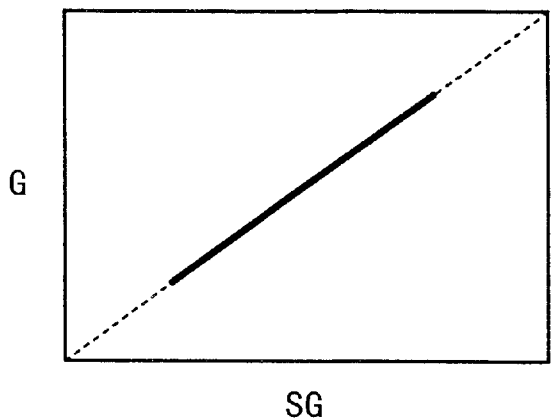
FIG. 6A is a view showing an operation wave form in an operation performance of the amplifier according to the present invention.
Figure 6B:
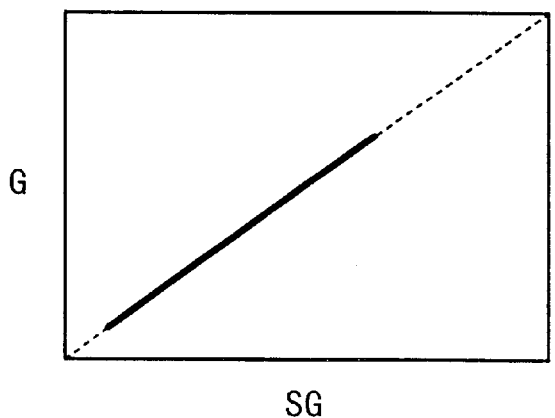
FIG. 6B is a view showing an operation wave form in an operation performance of the amplifier according to the present invention.
Figure 6C:
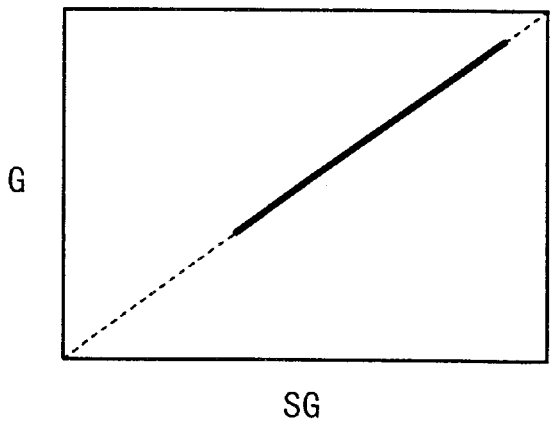
FIG. 6C is a view showing an operation wave form in an operation performance of the amplifier according to the present invention.

FIGS. 6A, 6B and 6C show the operation states of the variable amplifying circuit according to the present invention. FIG. 6A shows an operation wave form of the variable gain amplifying apparatus 1. The wave form shown in FIG. 6A is a wave form when the gain of the second amplifying circuit B is constantly fixed to (8 dB), and it indicates a gain change width between 0 and 76 dB in the variable gain amplifying apparatus 1. FIG. 4B shows an operation wave form of the variable gain amplifying apparatus 1'. The wave form shown in FIG. 6B is a wave form when the second amplifying circuit B (the digitally controlled variable amplifier 10) is set at the low gain (0 dB), and it indicates a gain change width between 8 and 68 dB in the variable gain amplifying apparatus 1'. FIG. 6C shows an operation wave form of the variable gain amplifying apparatus 1'. The wave form shown in FIG. 6C is a wave form when the second amplifying circuit B (the digitally controlled variable amplifier 10' is set at the high gain (16 dB), and it shows a gain change width between 8 and 84 dB in the variable gain amplifying apparatus 1'.

Figure 7A:
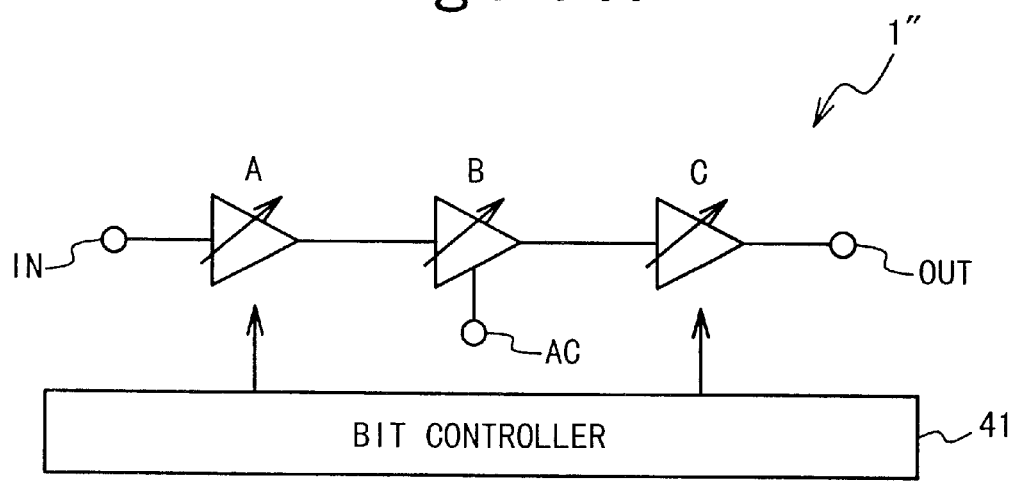
FIG. 7A is a view showing a concept of another configuration of the amplifier according to the present invention.
Figure 7B:
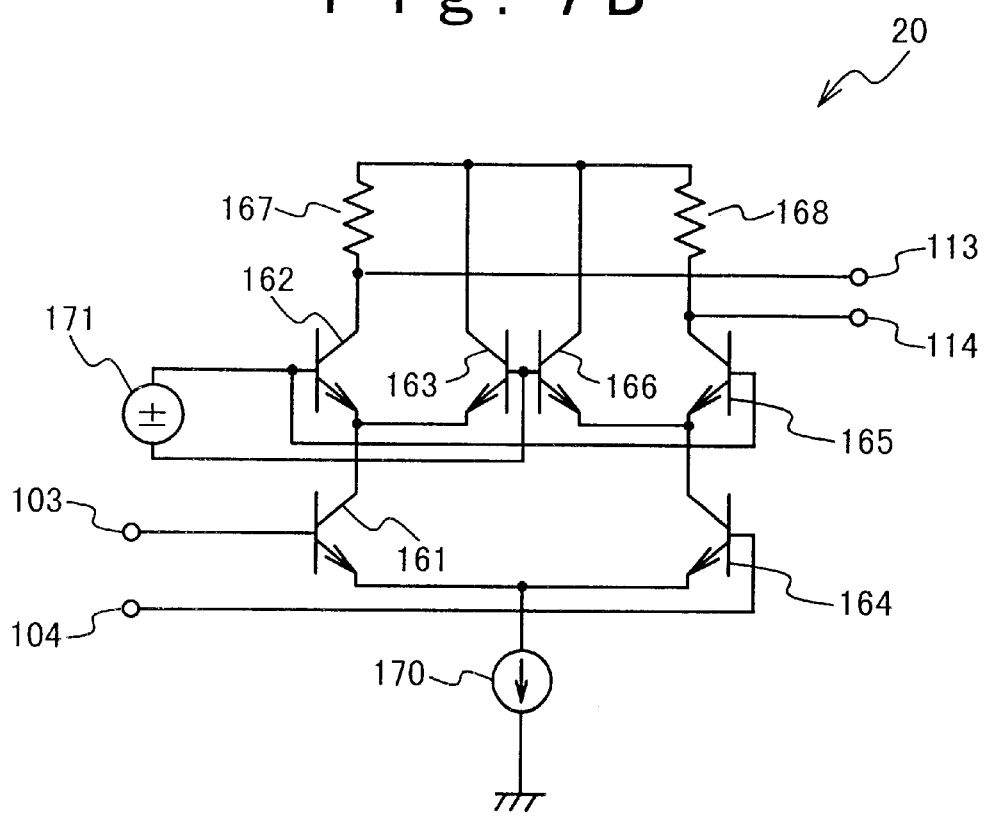
FIG. 7B is a view showing a configuration of an analogously controlled variable amplifier according to the present invention.

FIGS. 7A, 7B show other configurations of the amplifiers according to the present invention. FIG. 7A shows the concept of the configuration of a variable gain amplifying apparatus 1" according to the present invention, and FIG. 7B shows the configuration of an analogously controlled variable amplifier 20 according to the present invention.

The variable gain amplifying apparatus 1" shown in FIG. 7A is provided with an input IN, an output OUT, a first amplifying circuit A, a second amplifying circuit B, a third amplifying circuit C and a digital bit controller (gain control signal generator) 41. Gains of the first and third amplifying circuits A, C can be changed during the operation of the variable gain amplifying apparatus 1", in accordance with a first control signal and a second control signal outputted by the digital bit controller 41. A gain of the second amplifying circuit B can be changed before the operation (before the execution of an amplifying operation) of the variable gain amplifying apparatus 1", in accordance with a third control signal (an analog type) outputted by a control signal generator (not shown). The third control signal services as a voltage source or a current source for setting the gain of the second amplifying circuit B.

The analogously controlled variable amplifier 20 shown in FIG. 7B can constitute the first to third amplifying circuits A to C, similarly to the digitally controlled variable amplifier 10. Here, the case of the configuration of the second amplifying circuit B is described as an example.

The analog controlled variable amplifier 20 is provided with a first transistor 161, a second transistor 162, a third transistor 163, a fourth transistor 164, a fifth transistor 165, a sixth transistor 166, a first resistor 167, a second resistor 168, a current source 170 and a voltage source (gain setting circuit) 171.

An input terminal 103 is connected to a base of the first transistor 161. A collector of the first transistor 161 is connected to an emitter of the second transistor 162. An emitter of the first transistor 161 is connected to an input terminal of the current source 170. A base of the second transistor 162 is connected to one terminal of the voltage source 171. A collector of the second transistor 162 is connected to an output terminal 113. The collector of the second transistor 162 is connected to one terminal of the first resistor 167. The emitter of the second transistor 162 is connected to an emitter of the third transistor 163. A base of the third transistor 163 is connected to the other terminal of the voltage source 171. And, a collector of the third transistor 163 is connected to the other terminal of the first resistor 167.

An input terminal 104 is connected to a base of the fourth transistor 164. A collector of the fourth transistor 164 is connected to an emitter of the fifth transistor 165. An emitter of the fourth transistor 164 is connected to the input terminal of the current source 170. An output terminal of the current source 170 is grounded. A base of the fifth transistor 165 is connected to the other terminal of the voltage source 171. A collector of the fifth transistor 165 is connected to an output terminal 114. The collector of the fifth transistor 165 is connected to one terminal of the second resistor 168. The emitter of the fifth transistor 165 is connected to an emitter of the sixth transistor 166. A base of the sixth transistor 166 is connected to the base of the third transistor 163. A collector of the sixth transistor 166 is connected to the other terminal of the second resistor 168. And, the collector of the sixth resistor 166 is connected to the collector of the third transistor 163.

In the analog controlled variable amplifier 20 having the above-mentioned configuration, a voltage of the voltage source 171 is continuously changed in accordance with the third control signal. A gain of the analog controlled variable amplifier 20 (second amplifying circuit B) is continuously changed in accordance with the change in the voltage of the voltage source 171. If the gain of the second amplifying circuit B is continuously changed, for example, it is possible to select any band between the gain change width shown in FIG. 6B and the gain change width shown in FIG. 6C. The analog controlled variable amplifier 20 does not suffer from the characteristics of devices constituting the analog controlled variable amplifier 20. Thus, it is possible to set a desirable gain band.

The analog controlled variable amplifier 20 can attain the continuous change in the gain. The amplifier 20, if the output voltage of the voltage source 171 is adjusted, can carry out the operations of the high gain mode and the low gain mode shown in FIGS. 6A, 6B and 6C. The amplifier 20 can set a desirable gain without the influence from the characteristics of the devices constituting the amplifier 20.

The voltage source 171 of the analog controlled variable amplifier 20 is controlled in accordance with the third control signal (the change in the voltage or the current). If the voltage source 171 can correspond to a digital control, the third control signal is generated in a digital type.

The gain setting circuit of the analog controlled variable amplifier 20 is not limited to the voltage source 171. The analog controlled variable amplifier 20 may be another device which can change an amplification factor of the amplifying circuit, for example, a current source or a switching device.

FIGS. 8A, 8B show a second configuration example of the variable gain amplifying apparatus according to the present invention. FIG. 8A shows the device arrangement of a variable gain amplifying apparatus 2 according to the present invention, and FIG. 8B shows the gain performance of the variable gain amplifying apparatus 2 according to the present invention. FIG. 8B shows gains of respective amplifiers of a first amplifying circuit A, a second amplifying circuit B and a third amplifying circuit C. The first amplifying circuit A has a gain change width between 0 and 56 dB. In the second amplifying circuit B, its gain is set to 0 dB. The third amplifying circuit C has a gain change width between −8 and 20.

The variable gain amplifying apparatus 2 shown in FIG. 8A is provided with an input IN, an output OUT, a first amplifying circuit A, a second amplifying circuit B, a third amplifying circuit C and a digital bit controller (gain control signal generator) 81. The first amplifying circuit A is composed of A1-th to A8-th amplifiers 51 to 58. The second amplifying circuit B is composed of a B1-th amplifier 61. And, the third amplifying circuit C is composed of C1-th to C8-th amplifiers 71 to 78.

The input IN is inputted to inputs of the A1-th to A8-th amplifiers 51 to 58. Outputs of the A1-th to A8-th amplifiers 51 to 58 are connected to an input of the B1-th amplifier 61. An output of the B1-th amplifier 61 is connected to inputs of the C1-th to C8-th amplifiers 71 to 78. And, outputs of the C1-th to C8-th amplifiers 71 to 78 are connected to the output OUT.

The digital bit controller 81 outputs a first control signal to the first amplifying circuit A. The first control signal indicates three-bit values (000) to (111), since the first amplifying circuit A is composed of the A1-th to A8-th amplifiers 51 to 58 (eight stages (=twenty-three stages) ). The digital bit controller 81 outputs a second control signal to the third amplifying circuit C. The second control signal indicates the three-bit values (000) to (111), since the third amplifying circuit C is composed of the C1-th to C6-th amplifiers 71 to 78 (eight stages (=twenty-three stages) By the way, the value of the control signal is one example, and it may be set arbitrarily.

The input IN is a terminal to which an input signal is inputted. A gain of the first amplifying circuit A is set in accordance with the first control signal outputted by the digital bit controller 81.

The gain of the first amplifying circuit A is set in accordance with the first control signal. With reference to FIG. 8B, if the first control signal indicates the value (00), the A1-th amplifier 51 is made active. The A1-th amplifier 51 executes the amplification of the gain of 0 dB. The gain of the first amplifying circuit A indicates 0 dB. If the first control signal indicates the value (001), the A2-th amplifier 52 is made active. The A2-th amplifier 52 executes the amplification of the gain of 8 dB. The gain of the first amplifying circuit A indicates 8 dB. If the first control signal indicates the value (010), the A3-th amplifier 53 is made active. The A3-th amplifier 53 executes the amplification of the gain of 16 dB. The gain of the first amplifying circuit A indicates 16 dB. If the first control signal indicates the value (011), the A4-th amplifier 54 is made active. The A4-th amplifier 54 executes the amplification of the gain of 24 dB. The gain of the first amplifying circuit A indicates 24 dB. If the first control signal indicates the value (100), the A5-th amplifier 55 is made active. The A5-th amplifier 55 executes the amplification of the gain of 32 dB. The gain of the first amplifying circuit A indicates 32 dB. If the first control signal indicates the value (101), the A6-th amplifier 56 is made active. The A6-th amplifier 56 executes the amplification of the gain of 40 dB. The gain of the first amplifying circuit A indicates 40 dB. If the first control signal indicates the value (110), the A7-th amplifier 57 is made active. The A7-th amplifier 57 executes the amplification of the gain of 48 dB. The gain of the first amplifying circuit A indicates 48 dB. If the first control signal indicates the value (111), the A8-th amplifier 58 is made active. And, the A8-th amplifier 58 executes the amplification of the gain of 56 dB. The gain of the first amplifying circuit A indicates 56 dB. By the way, the value of the control signal is one example. It may be arbitrarily set.

The B1-th amplifier 61 of the second amplifying circuit B is always made active. With reference to FIG. 6B, the B1-th amplifier 61 executes the amplification of the gain of 0 dB. The gain of the second amplifying circuit B indicates 0 dB.

The gain of the third amplifying circuit C is set in accordance with the second control signal. With reference to FIG. 6B, if the second control signal indicates the value (000), the C1-th amplifier 71 is made active. The C1-th amplifier 71 executes the amplification of the gain of −8 dB. The gain of the third amplifying circuit C indicates −8 dB. If the second control signal indicates the value (001), the C2-th amplifier 72 is made active. The C2-th amplifier 72 executes the amplification of the gain of −4 dB. The gain of the third amplifying circuit C indicates −4 dB. If the second control signal indicates the value (010), the C3-th amplifier 73 is made active. The C3-th amplifier 73 executes the amplification of the gain of 0 dB. The gain of the third amplifying circuit C indicates 0 dB. If the second control signal indicates the value (011), the C4-th amplifier 74 is made active. The C4-th amplifier 74 executes the amplification of the gain of 4 dB. The gain of the third amplifying circuit C indicates 4 dB. If the second control signal indicates the value (100), the C5-th amplifier 75 is made active. The C5-th amplifier 75 executes the amplification of the gain of 8 dB. The gain of the third amplifying circuit C indicates 8 dB. If the second control signal indicates the value (101), the C6-th amplifier 76 is made active. The C6-th amplifier 76 executes the amplification of the gain of 12 dB. The gain of the third amplifying circuit C indicates 12 dB. If the second control signal indicates the value (110), the C7-th amplifier 77 is made active. The C7-th amplifier 77 executes the amplification of the gain of 16 dB. The gain of the third amplifying circuit C indicates 16 dB. And, if the second control signal indicates the value (111), the C8-th amplifier 78 is made active. The C8-th amplifier 78 executes the amplification of the gain of 20 dB. The gain of the third amplifying circuit C indicates 20 dB. By the way, the value of the control signal is one example. It may be arbitrarily set.

The variable gain amplifying apparatus 2 according to the present invention executes the minimum amplification of −8 dB. The variable gain amplifying apparatus 2 executes the maximum amplification of 76 dB.

The variable gain amplifying apparatus 2 can set the gain between 0 and 76 dB, similarly to the variable gain amplifying apparatuses 1, 1' and 1". The first control signal outputted by the digital bit controller 81 indicates the three-bit digital signal. The second control signal outputted by the digital bit controller 81 indicates the three-bit digital signal. If a six-bit digital control signal is outputted by the digital bit controller 81, a portion of the higher three bits indicates the first control signal, and a portion of the lower three bits indicates the second control signal.

It is desirable to set the gains of the first amplifying circuit A and the second amplifying circuit C such that the gain of the first amplifying circuit A is greater than that of the third amplifying circuit C. If the gain (total gain) of the variable gain amplifying apparatus 2 is set to 0 dB, the gain of the first amplifying circuit A is set to 8 dB, and the gain of the third amplifying circuit C is set to −8 dB. If the total gain is set to 4 dB, the gain of the first amplifying circuit A is set to 8 dB, and the gain of the third amplifying circuit C is set to −4 dB. If the total gain is set to 76 dB, the gain of the first amplifying circuit A is set to 56 dB, and the gain of the third amplifying circuit C is set to 20 dB. In any setting, the gain of the first amplifying circuit A is set to be greater than that of the third amplifying circuit C. Such a setting contributes to the drop in the noise figure NF of the variable gain amplifying apparatus.

By the way, an inverse proportion occurs between the characteristics of the noise figure NF and the distortion. The improvement in the noise figure NF is carried out within an actual range of the distortion characteristic, in accordance with a specification of a system using the variable gain amplifying apparatus.

The second amplifying circuit B of the variable gain mplifying apparatuses 1, 2 according to the present invention may have the configuration in which the gain can be changed. The change in the gain of the second amplifying circuit B is set before the operations of the variable gain amplifying apparatuses 1, 2 (before the executions of the amplifying processes). The gain of the second amplifying circuit B is fixed during the operations of the variable gain amplifying apparatuses 1, 2. If the gain of the second amplifying circuit B is fixed during the operations of the variable gain amplifying apparatuses 1, 2, a change in an impedance associated with the gain change in the first amplifying circuit A has no influence on the third amplifying circuit C. If the gain of the second amplifying circuit B is fixed, a change in an impedance associated with the gain change in the third amplifying circuit C has no influence on the first amplifying circuit A. The second amplifying circuit B can interrupt the mutual action between the impedance of the first amplifying circuit A and the impedance of the third amplifying circuit C.

As for the transistors constituting the amplifier, a bipolar transistor is disclosed in the drawing. However, the transistor may be a field effect transistor (MOS transistor).

The number of amplifies constituting the amplifying circuit may be changed in accordance with the gain to which one amplifier can correspond.

In the case of an effect of the variable amplifying apparatus according to the present invention, the number of stages in the amplifying circuits in which the amplifiers are coupled parallel to each other is limited to three. This limitation enables the variable amplifying apparatus according to the present invention to reduce the increase factors in the total noise figure. Also, this limitation can avoid the phase performance of the variable amplifying apparatus from being deteriorated. The variable amplifying apparatus according to the present invention can avoid an abnormal oscillation resulting from the deterioration in the phase performance.

In the variable amplifying apparatus according to the present invention, it is not necessary to make all the amplifiers constituting the amplifying circuit active. The variable amplifying apparatus according to the present invention can reduce the consumptive electric power to a necessary minimum.

What is claimed is:

1. A variable gain amplifying apparatus comprising:
    a first amplifying circuit having a first variable gain when the first amplifying circuit is activated;
    a second amplifying circuit having a second gain and having an input which is connected to an output of the first amplifying circuit;
    a third amplifying circuit having a third gain when the third amplifying circuit is activated and having an input which is connected to an output of the second amplifying circuit, wherein said first, second and third amplifying circuits are connected in series; and
    a gain controller generating gain control signals which are applied to the first and third amplifying circuits such that the first and third gains are set to predetermined gains, respectively;
    wherein the second gain is a fixed gain;
    the first amplifying circuit comprises a plurality of first amplifiers which are activitated to set the first variable gain based on the gain control signal;
    the second amplifying circuit has a single second amplifier; and
    the third amplifying circuit comprises a plurality of third amplifiers which are activated to set the third variable gain based on the gain control signal.

2. A variable gain amplifying apparatus a s claimed in claim 1,
    wherein the second gain is a fixed gain.

3. A variable gain amplifying apparatus as claimed in claim 2,
    wherein the first amplifying circuit comprises a plurality of first amplifiers which are activated to set the first variable gain based on the gain control signal;
    the second amplifying circuit has a single second amplifier; and
    the third amplifying circuit comprises a plurality of third amplifiers which are activated to set the third variable gain based on the gain control signal.

4. A variable gain amplifying apparatus as claimed in claim 3,
    wherein the first amplifiers are digitally controlled based on the control signal; and
    the third amplifiers are digitally controlled based on the control signal.

5. A variable gain amplifying apparatus as claimed in claim 3,
    wherein the first amplifiers are analog controlled based on the control signal; and
    the third amplifiers are analog controlled based on the control signal.

6. A variable gain amplifying apparatus as claimed in claim 5,
    wherein each of the first and third amplifiers has a transistor which is controlled based on a voltage or a current which is applied to the transistor based on the control signal.

7. A variable gain amplifying apparatus as claimed in claim 2,
    wherein the first variable gain of the first amplifying circuit is larger than the third variable gain of the third amplifying circuit.

8. A variable gain amplifying apparatus as claimed in claim 2,
    wherein the second amplifying circuit functions to prevent in the case of an effect of a first impedance of the first amplifying circuit to the third amplifying circuit.

9. A variable gain amplifying apparatus as claimed in claim 1,
    wherein the second gain is a variable gain.

10. A variable gain amplifying apparatus as claimed in claim 9,
    wherein the first amplifying circuit comprises a plurality of first amplifiers which are activated to set the first variable gain based on the gain control signal;
    the second amplifying circuit has a single second amplifier of which gain is changed when the second amplifying circuit is activated; and
    the third amplifying circuit comprises a plurality of third amplifiers which are activated to set the third variable gain based on the gain control signal.

11. A variable gain amplifying apparatus as claimed in claim 10,
    wherein the first amplifiers are digitally controlled based on the control signal;

the second amplifiers are digitally controlled based on the control signal; and the third amplifiers are digitally controlled based on the control signal.

12. A variable gain amplifying apparatus as claimed in claim 10, wherein the first amplifiers are analog controlled based on the control signal; and the third amplifiers are analog controlled based on the control signal.

13. A variable gain amplifying apparatus as claimed in claim 12, wherein each of the first and third amplifiers has a transistor which is controlled based on a voltage or a current which is applied to the transistor based on the control signal.

14. A variable gain amplifying apparatus as claimed in claim 9, wherein the first variable gain of the first amplifying circuit is larger than the third variable gain of the third amplifying circuit.

15. A variable gain amplifying apparatus as claimed in claim 9, wherein the second amplifying circuit functions to prevent in the case of an effect of a first impedance of the first amplifying circuit to the third amplifying circuit.

16. A variable gain amplifying apparatus as claimed in claim 9, wherein the first amplifying circuit comprises a plurality of first amplifiers which are activated to set the first variable gain based on the gain control signal;

the second amplifying circuit comprises a plurality of second amplifiers which are activated to set the second variable gain based on the gain control signal when the second amplifying circuit is in activated; and the third amplifying circuit comprises a plurality of third amplifiers which are activated to set the third variable gain based on the gain control signal.

17. A variable gain amplifying apparatus as claimed in claim 16, wherein the first amplifiers are digitally controlled based on the control signal;

the second amplifiers are digitally controlled based on the control signal; and the third amplifiers are digitally controlled based on the control signal.

18. A variable gain amplifying apparatus as claimed in claim 16, wherein the first amplifiers are analog controlled based on the control signal;

the second amplifiers are analog controlled based on the control signal; and the third amplifiers are analog controlled based on the control signal.

19. A variable gain amplifying apparatus as claimed in claim 18, wherein each of the first and third amplifiers has a transistor which is controlled based on a voltage or a current which is applied to the transistor based on the control signal.

20. A variable gain amplifying apparatus as claimed in claim 16, wherein the first variable gain of the first amplifying circuit is larger than the third variable gain of the third amplifying circuit.

21. A variable gain amplifying apparatus as claimed in claim 16, wherein the second amplifying circuit functions to prevent in the case of a first impedance of the first amplifying circuit to the third amplifying circuit.

22. A variable gain amplifying apparatus as claimed in claim 2, wherein the second amplifying circuit has an impedance matching function to prevent in the case of an effect of a first impedance of the first amplifying circuit to the third amplifying circuit.

23. A variable gain amplifying apparatus as claimed in claim 8, wherein the second amplifying circuit has an impedance matching function to prevent in the case of an effect of a first impedance of the first amplifying circuit to the third amplifying circuit.

24. A method for controlling a variable gain amplifying apparatus comprising:

setting a first gain of a first variable gain circuit;

setting a second gain of a second variable gain circuit which is arranged on a later stage of the first variable gain circuit, wherein the second gain is a fixed gain; and setting a third gain of a third variable gain circuit such that the first gain is larger than the third gain, wherein the first amplifying circuit and the third variable gain circuit are separated by the second amplifying circuit such that an effect of a first impedance of the first variable gain circuit and an effect of a third impedance of the third amplifying circuit are separated;

wherein the first amplifying circuit comprises a plurality of first amplifiers which are activiated to set the first variable gain bawsedon the gain control signal;

the second amplifying circuit has a single second amplifier; and the third variable gain circuit comprises a plurality of third amplifiers which are activated to set the third variable gain based on the gain control signal.

25. A method for controlling a variable gain amplifying apparatus as claimed in claim 24, comprising, generating a control signal which is applied to the first to the third variable gain circuits and controls the first to third gains.

* * * * *

UNITED STATES PATENT AND TRADEMARK OFFICE
CERTIFICATE OF CORRECTION

PATENT NO. : 6,326,842 B1 Page 1 of 1
DATED : December 4, 2001
INVENTOR(S) : Kuroda It is certified that error appears in the above-identified patent and that said Letters Patent is hereby corrected as shown below:

Column 18,
Line 46, "bawsedon" should be -- based on --

Signed and Sealed this

Eighteenth Day of June, 2002

Attest:

JAMES E. ROGAN
Attesting Officer      Director of the United States Patent and Trademark Office